United States Patent [19]

Kasai et al.

[11] Patent Number: 5,220,186

[45] Date of Patent: Jun. 15, 1993

[54] SEMICONDUCTOR DEVICE WITH A MUSHROOM-SHAPED GATE ELECTRODE

[75] Inventors: Nobuyuki Kasai; Shinichi Sakamoto; Takuji Sonoda; Tetsuya Yagi, all of Itami, Japan

[73] Assignee: Mitsubishi Denki Kabushiki Kaisha, Tokyo, Japan

[21] Appl. No.: 802,560

[22] Filed: Dec. 5, 1991

[30] Foreign Application Priority Data

Dec. 26, 1990 [JP] Japan ............................. 2-406358

[51] Int. Cl.$^5$ .................... H01L 29/80; H01L 27/095
[52] U.S. Cl. .................... 257/284; 257/280; 257/472
[58] Field of Search ............... 357/22, 22 I; 437/175, 437/176, 177; 257/280, 284, 472

[56] References Cited

U.S. PATENT DOCUMENTS

| 4,213,840 | 7/1980 | Omori et al. .................. 357/22 I |
| 4,808,545 | 2/1989 | Balasubramanyan et al. ..... 357/22 I |
| 4,935,805 | 6/1990 | Calviello et al. .................. 357/22 |
| 5,057,883 | 10/1991 | Noda .................................. 357/22 |

FOREIGN PATENT DOCUMENTS

| 61-55969 | 3/1986 | Japan ................................. 357/22 I |
| 61-55970 | 3/1986 | Japan ................................. 357/22 I |
| 62-156876 | 7/1987 | Japan ................................. 357/22 |
| 63-95676 | 4/1988 | Japan ................................. 357/22 |
| 63-155771 | 6/1988 | Japan ................................. 357/22 |
| 63-204658 | 8/1988 | Japan ................................. 357/22 |
| 63-173363 | 11/1988 | Japan ................................. 357/22 |
| 1-157574 | 6/1989 | Japan ................................. 357/22 |
| 1-260861 | 10/1989 | Japan ................................. 357/22 |

OTHER PUBLICATIONS

Wang et al., "A 0.1-$\mu$m Al$_{0.5}$IN$_{0.5}$As/Ga$_{0.5}$IN$_{0.5}$As MODFET Fabricated on GaAs Substrates", IEEE Transactions on Electron Devices vol. 35, No. 7, Jul. 1988, pp. 818–823.

Jones et al., "Very Low-Noise HEMTs Using A 0.2 $\mu$m T-Gate", Electronics Letters, vol. 23, No. 16, Jul. 1987, pp. 844–845.

Primary Examiner—Rolf Hille
Assistant Examiner—Steven Loke
Attorney, Agent, or Firm—Leydig, Voit & Mayer

[57] ABSTRACT

A mushroom-shaped gate electrode has a lower end in a recess in a semiconductor active layer on a semiconductor substrate. The gate electrode has an enlarged head. A metallic side wall is disposed on a portion of the leg of the gate electrode adjacent the head. Thus, the gate length of a semiconductor device, such as a field effect transistor, is reduced while the effective cross-sectional area of the gate electrode is increased whereby the noise characteristics of the semiconductor device are improved.

8 Claims, 7 Drawing Sheets

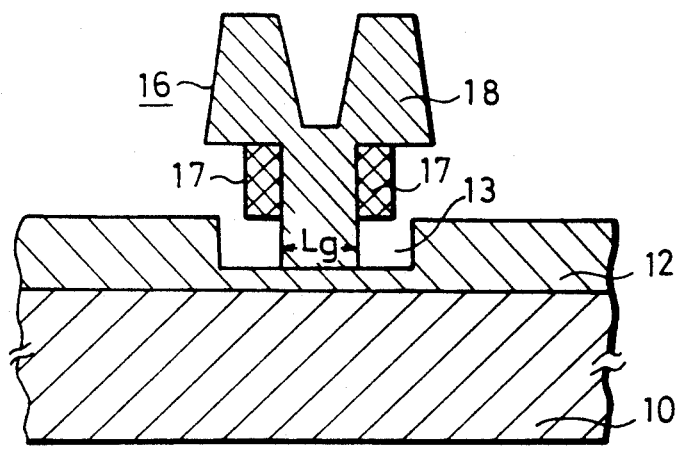
F I G. 5

SEMICONDUCTOR DEVICE WITH A MUSHROOM-SHAPED GATE ELECTRODE

The present invention relates to a gate electrode of a semiconductor device, such as a field effect transistor (FET), and also to a method of making it.

BACKGROUND OF THE INVENTION

FIG. 1 is a cross-sectional view of a conventional gate electrode of a semiconductor device, which comprises a semiconductor substrate 1, a semiconductor active layer 2 disposed on the substrate 1, and a gate electrode 4 having a gate length Lg in a recess 3 formed in the surface of the active layer 2.

The gate electrode 4 having a cross-sectional structure as shown in FIG. 1 may be formed in the following manner.

As shown in FIG. 2, the semiconductor active layer 2 is formed on the semiconductor substrate 1, and a photoresist layer 30 is disposed on the semiconductor active layer 2. Then, by means of a photolithographic technique, such as electron beam lithography, the photoresist layer 30 is patterned to have an opening 5 formed therein. The opening 5 extends to the active layer 2. The width $t_1$ of the opening 5 determines the gate length Lg of the completed gate electrode 4 shown in FIG. 1.

Next, as shown in FIG. 3, the recess 3 having a desired depth and width is formed in the active layer by, for example, wet etching, using the photoresist layer 30 as a mask.

After that, as shown in FIG. 4, a gate electrode metal is deposited by, for example, vacuum vapor deposition to form a gate electrode metal layer 60 on the photoresist layer 30. When the gate electrode metal layer 60 having a thickness h is formed on the photoresist layer 30, a layer 61 of the gate electrode metal having a thickness substantially equal to h is also deposited in the recess 3. As the gate electrode metal is vapor deposited, a small amount 62 of the metal is also deposited on an upper portion of the opening 5 in the photoresist layer 30, so the opening 5 becomes smaller and smaller. Accordingly, the amount of the gate electrode metal passing through the opening 5 gradually decreases, which results in tapering of the gate electrode metal layer 61 formed in the recess 3 as shown.

Then, the photoresist layer 30 and the gate electrode metal layer 60 on the photoresist layer 30 are lifted off, which leaves the gate electrode 4 in the recess 3 as shown in FIG. 1.

It is known that one factor which determines device characteristics, such as a noise figure (NF), of, for example, FET's is the gate length Lg, and that as the gate length Lg is smaller, the NF is improved. However, as the gate length Lg becomes smaller, the cross-sectional area of the gate electrode 4 may also become smaller, which, in turn, increases gate resistance and, hence, degrades the NF. Accordingly, in order to reduce the length Lg of the conventional gate electrode and still increase its cross-sectional area for preventing the gate resistance from increasing, the thickness or height h must be increased. However, for the gate length Lg of less than about 0.3 μm, the thickness of the photoresist layer 30 cannot be increased in view of patterning and lift-off processing. This imposes a limitation on the height h of the gate electrode 4, and, it is impossible to use a larger height h in order to increase the cross-sectional area of the gate electrode 4. For this reason, a semiconductor device with a gate electrode having a structure as shown in FIG. 1 cannot have an improved NF.

A gate electrode having a reduced gate length Lg and having a large cross-sectional area has been proposed in, for example, Japanese Published Patent Application No. SHO 63-273363. The gate electrode shown in the Japanese application has a T-shaped structure. With the gate electrode structure shown in this Japanese application, however, dielectric films, such as a silicon oxide film and a silicon nitride film, are present in the space between the gate electrode and the active layer, which result in undesired parasitic capacitance.

Another technique for reducing the gate length Lg of a gate electrode is shown in Japanese Published Patent Application No. SHO 63-95676. The gate electrode structure disclosed in this Japanese patent application is aimed only to reducing the gate length, and it is not contemplated to reduce both the gate length and the gate resistance.

Japanese Published Patent Application No. SHO 63-155771 shows a semiconductor device with a T-shaped gate electrode. However, the invention of the Japanese application has been contemplated for displacing the T-shaped gate electrode toward a source electrode from the center of the distance between the source and drain electrodes of the device. This Japanese application does not specifically mention the reduction of the gate electrode length and the reduction of the gate resistance.

SUMMARY OF THE INVENTION

An object of the present invention is to provide a gate electrode structure with a reduced gate length as well as reduced gate resistance.

A gate electrode structure according to the present invention includes a so-called T-shaped or mushroom-shaped gate electrode (hereinafter referred to as mushroom-shaped gate electrode in general) which has an enlarged upper or head section and a lower or leg section, and a metallic side wall disposed on a portion of the leg section of the mushroom-shaped gate electrode except for the portion which determines the effective gate length the gate electrode. The metallic side wall is of a metal which is the same as or different from the metal of the mushroom-shaped gate electrode.

According to the present invention, the effective gate length of the gate electrode is determined by the length at the lowermost end of the electrode which directly contacts a recess in an active layer, and, accordingly, it is not small. Furthermore, the gate resistance is also sufficiently reduced because of the presence of the metallic side wall which increases the effective cross-sectional area of the gate electrode.

BRIEF DESCRIPTION OF THE DRAWINGS

FIG. 5 is a cross-sectional view of a major portion of a gate electrode structure according to a first embodiment of the present invention;

DETAILED DESCRIPTION OF PREFERRED EMBODIMENTS

Figure 1:
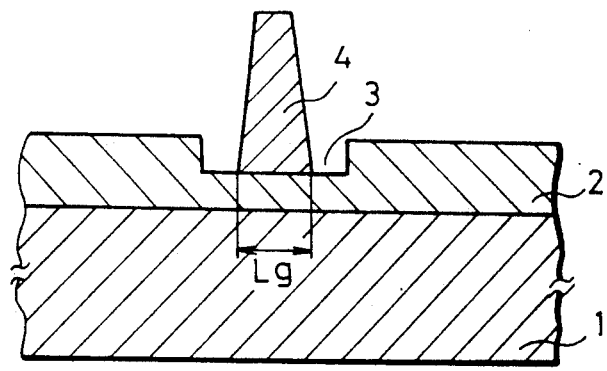
FIG. 1 is a cross-sectional view showing the structure of a major portion of a conventional gate electrode.
Figure 2:
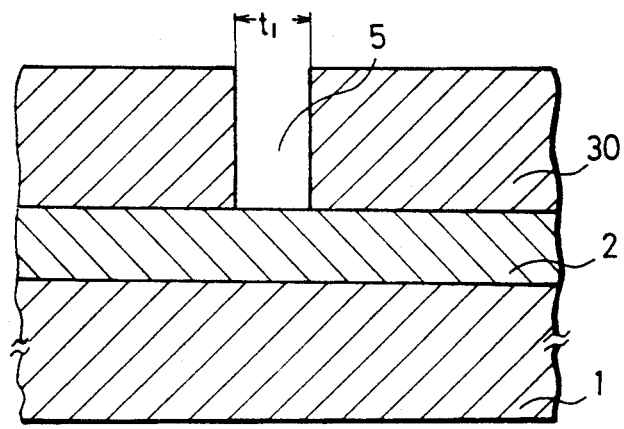
FIG. 2 is a cross-sectional view showing a first step of manufacturing the gate electrode of FIG. 1.
Figure 3:
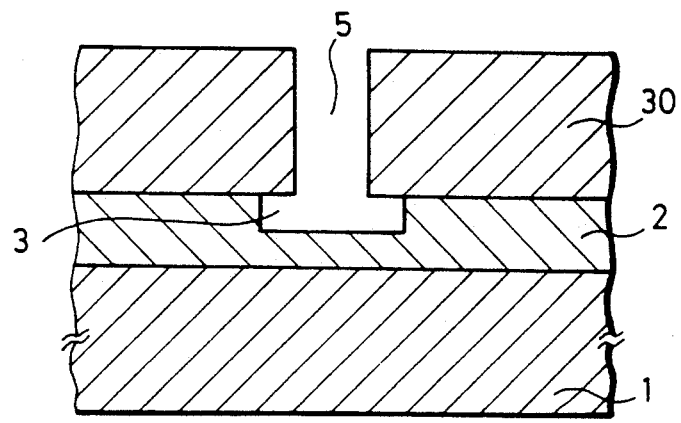
FIG. 3 is a cross-sectional view showing a second step of manufacturing the gate electrode of FIG. 1.
Figure 4:
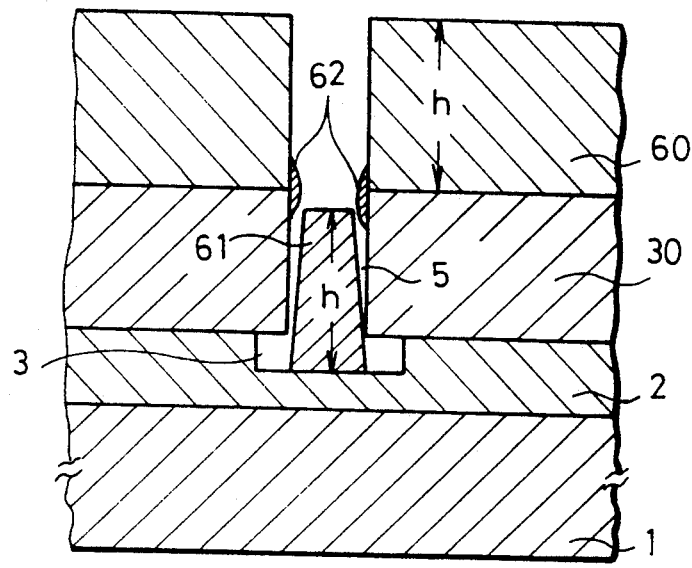
FIG. 4 is a cross-sectional view showing a third step of manufacturing the gate electrode of FIG. 1.

Now, referring to the accompanying drawings, a gate electrode structure according to the present invention and a method of making it are described in detail.

EXAMPLE 1

FIG. 5 shows a gate electrode structure according to a first embodiment of the present invention. A substrate 10 comprises a semiconductor material, such as GaAs and InP, and has a thickness of, for example, about 500 $\mu$m. A semiconductor active layer 12 of a material, such as N-type GaAs, N-type AlGaAs/GaAs and N-type InGaAs/GaAs, having a thickness of about 0.5 $\mu$m is disposed on the substrate 10. A recess 13 is formed in a predetermined portion of the semiconductor active layer 12 where a gate electrode is to be formed. The recess 13 has a depth of from about 0.1 $\mu$m to about 0.3 $\mu$m and a width of from about 0.6 $\mu$m to about 2.0 $\mu$m. A mushroom-shaped gate electrode 16 having an enlarged upper or head section 18 is formed in the recess 13. The length of that portion of the gate electrode 16 which is in contact with the recess 13, i.e. the effective gate length Lg of the gate electrode 16, is about 0.1 $\mu$m to about 0.3 $\mu$m. A metallic side wall 17 is disposed beneath and in contact with the enlarged head section 18 of the gate electrode 16. The addition of the metallic side wall increases the effective cross-sectional area of the gate electrode 16, maintaining the effective gate length Lg about 0.1 $\mu$m to 0.3 $\mu$m. This increase in the effective cross-sectional area, in turn, reduces the resistance of the gate electrode.

The gate electrode 16 may be formed of, for example, Ti/Pt/Au, WSi or any other suitable material. The metallic side wall 17 is formed of, for example, Al, Au, Ag, Mo, Pt, Ti, W, WSi or any other suitable material, and has a thickness of from about 0.2 $\mu$m to about 0.3 $\mu$m.

Next, a method of manufacturing the gate electrode of the present invention shown in FIG. 5 is described with reference to FIGS. 6–11.

Figure 6:
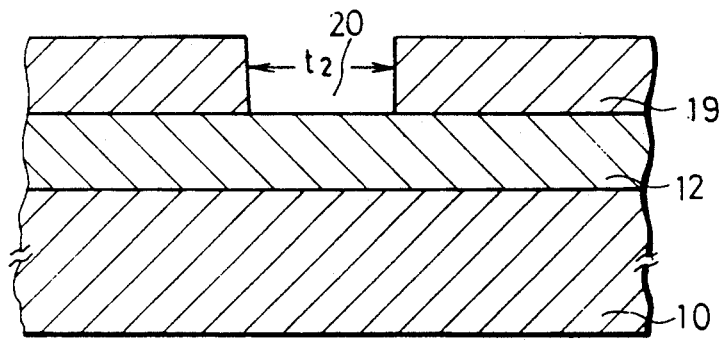
FIG. 6 is a cross-sectional view showing a first step of manufacturing the gate electrode of the first embodiment of the present invention shown in FIG. 5.

First, as shown in FIG. 6, on the semiconductor substrate 10 of a material, such as GaAs and InP, having a thickness of about 500 $\mu$m, the semiconductor active layer 12 of a material, such as N-type GaAs, N-type AlGaAs/GaAs and N-type InGaAs/GaAs, having a thickness of about 0.5 $\mu$m is disposed. On the semiconductor active layer 12, a first photoresist layer 19 is disposed to a thickness of about 0.4 $\mu$m. A photolithographic technique, such as electron beam lithography and optical exposure, is used to form an opening 20 in the photoresist layer 19 at where the gate electrode is to be formed. A positive resist, for example, such as ODUR and OEBR (both available from Tokyo Ohka Kogyo Kabushiki Kaisha, Kawasaki, Japan) may be used for the first photoresist layer 19. The opening 20 has a width $t_2$ of from about 0.5 $\mu$m to about 0.9 $\mu$m.

Figure 7:
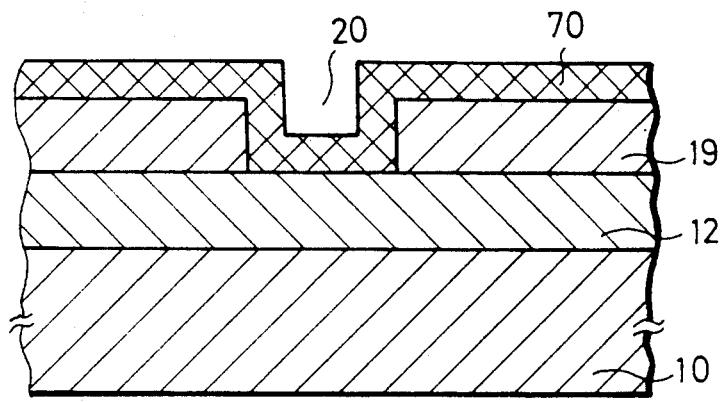
FIG. 7 is a cross-sectional view showing a second step of manufacturing the gate electrode shown in FIG. 5.

Next, as shown in FIG. 7, a layer 70 of a metal which may be the same as or different from the metal of the gate electrode which is subsequently formed, is disposed on the photoresist layer 19, by any suitable technique, such as sputtering, which can provide good step conformity, i.e. a technique which can deposit a layer conforming to the surface contour of an underlying layer. The metal usable for the metal layer 70 includes Al, Au, Ag, Mo, Pt, Ti, W, WSi, etc., and the thickness of the layer 70 is from about 0.2 $\mu$m to about 0.3 $\mu$m. As indicated in FIG. 7, the thickness of the metal layer 70 remains substantially the same on the peripheral wall and the bottom surface of the opening 20 as on the photoresist layer 19.

Figure 8:
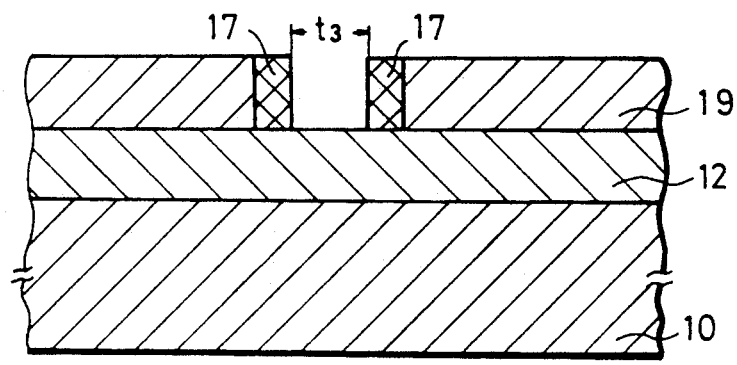
FIG. 8 is a cross-sectional view showing a third step of manufacturing the gate electrode shown in FIG. 5.
Figure 9:
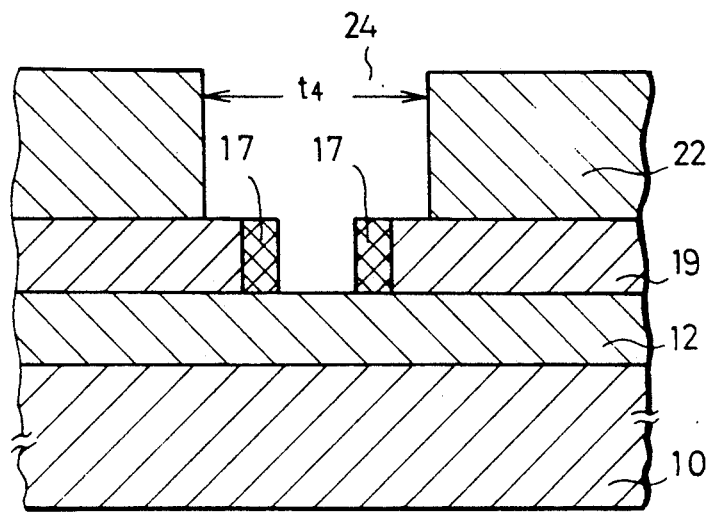
FIG. 9 is a cross-sectional view showing a fourth step of manufacturing the gate electrode shown in FIG. 5.
Figure 10:
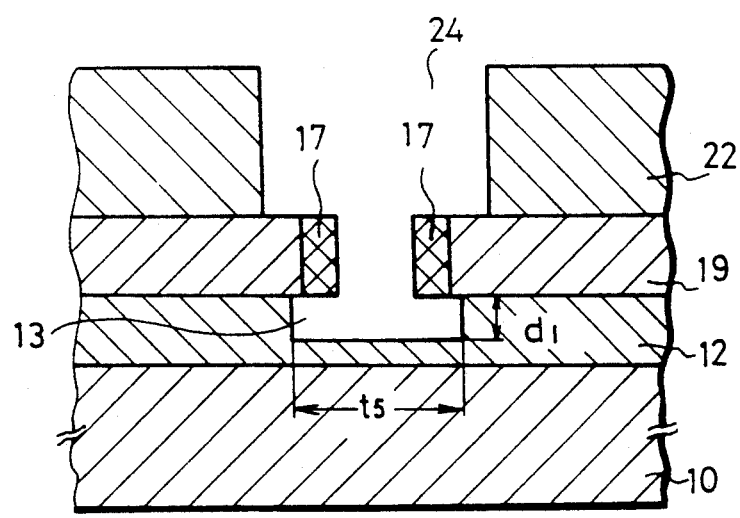
FIG. 10 is a cross-sectional view showing a fifth step of manufacturing the gate electrode shown in FIG. 5.

Next, as shown in FIG. 8, the metal layer 70 is removed, leaving the portion thereof on the peripheral wall of the opening 20 in the photoresist layer 19, which portion is to become the metallic side wall 17, by subjecting the metal layer 70 to selective anisotropic etching. The technique of anisotropic etching of the metal layer 70 is dry etching, such as, for example, reactive ion etching (RIE), reactive ion beam etching (RIBE) and electron cyclotron resonance (ECR) etching. Such ion etching utilizes, for example, $CF_4$ gas mixture such as $CF_4+O_2$ and $CF_4+H_2$, $SF_6$, $C_2F_6$ and $CCl_4$. It is important that the dry etching be conducted with a large difference between the etching rate of the metal layer 70 and that of the first photoresist layer 19 and the semiconductor active layer 12. The thickness of the metallic side wall 17 to be formed is from about 0.2 $\mu$m to about 0.3 $\mu$m.

Because of the presence of the metallic side wall 17, the width of the opening 20 is reduced to from $\frac{1}{3}$ to 1/5 of the original width $t_2$, i.e. the effective width $t_3$ of the opening 20 is from about 0.1 $\mu$m to about 0.3 $\mu$m. It is important to note that by appropriately selecting the thickness of the photoresist layer 19, the width $t_2$ of the opening 20 in the photoresist layer 19, and the thickness of the metal layer 70, any desired gate electrode length can be obtained, and, at the same time, any desired thickness can be selected for the metallic side wall 17 in order to increase the effective cross-sectional area of the gate electrode.

Thereafter, a second photoresist material is deposited over the entire surface of the structure shown in FIG. 8, and the thus deposited photoresist layer is patterned into a second photoresist layer 22 having an opening 24 formed therein. The sensitivity of the second photoresist layer 22 differs from that of the first photoresist layer 19 so that the first photoresist layer 19 is not affected by the exposure and development steps for the second photoresist layer 22. The width $t_4$ of the opening 24 in the second photoresist layer 22 determines the dimensions of the head section 18 of the gate electrode 16. For example, a positive resist, such as AZ1370 (available from Hoechst Japan Kabushiki Kaisha, Tokyo, Japan) and S1400-27 (available from Shipley Far East Kabushiki Kaisha, Tokyo, Japan) may be used as the second photoresist. The thickness of the second photoresist layer 22 is about 1.5 $\mu$m.

Thus, a photoresist structure having a profile necessary for forming the mushroom-shaped gate electrode 16 has been completed.

Then, the recess 13 (FIG. 10) is formed by etching away a portion of the semiconductor active layer 12 to a desired depth, with the metallic side wall 17 being used as a mask. For forming the recess 13, a wet etching technique using, for example, a phosphoric acid or nitric acid etchant, is employed. The recess 13 has a width $t_5$ of from about 0.6 $\mu$m to about 2.0 $\mu$m and a depth $d_1$ of about 0.3 $\mu$m.

Figure 11:
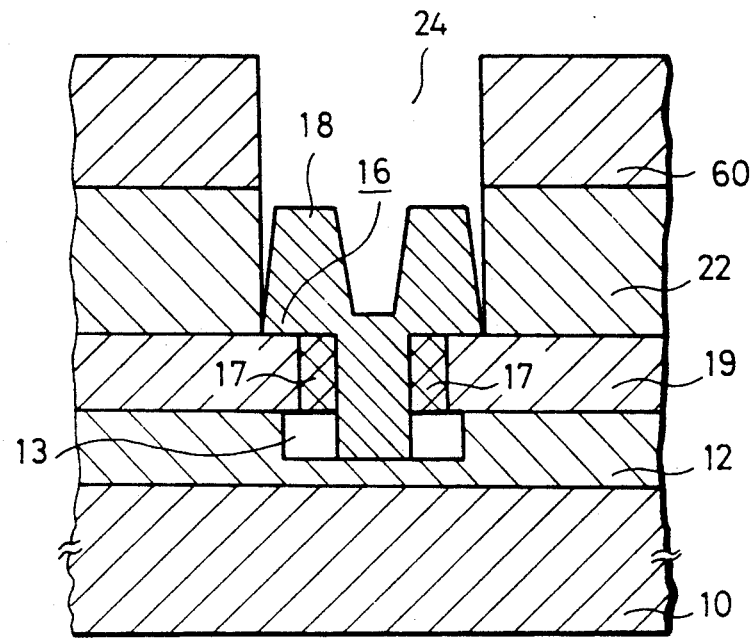
FIG. 11 is a cross-sectional view showing a sixth step of manufacturing the gate electrode shown in FIG. 5.

Next, as shown in FIG. 11, a layer 60 of the gate metal is deposited, by, for example, vacuum vapor deposition. By the vacuum vapor deposition of the layer 60, the gate metal is also deposited in the opening 24, as shown, and the bottom end of the deposition of the gate electrode metal comes into contact with the semiconductor active layer 12 in the recess 13. Thus, the gate electrode 16 with the head section 18 is formed in the opening 24. The gate electrode metal is a material, such as Ti/Pt/Au and WSi.

The first photoresist layer 19, the second photoresist layer 22 and the unnecessary gate electrode metal layer 60 on the second photoresist layer 22 are lifted off, which results in the gate electrode 16 with the metallic side wall 17 formed in the thinned portion beneath the head section 18 shown in FIG. 5.

As previously stated, the gate electrode 16 having the structure shown in FIG. 5 has a reduced effective gate length Lg of about 0.1 $\mu$m to about 0.3 $\mu$m, and has an increased effective cross-sectional area due to the presence of the metallic side wall 17. Accordingly, the noise factor NF of the device shown in FIG. 5 is substantially improved.

EXAMPLE 2

Figure 12:
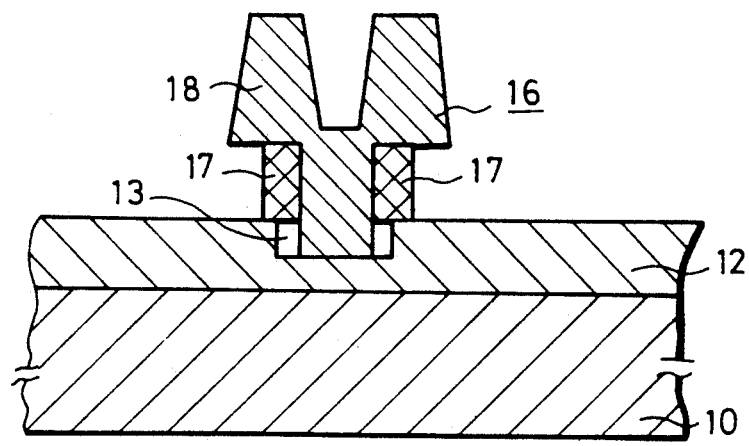
FIG. 12 is a cross-sectional view illustrating a problem which could be seen in the gate electrode according to the first embodiment shown in FIG. 5.

Although the gate electrode structure shown in FIG. 5 provides satisfactory device characteristics, it may sometimes happen that when the recess 13 is formed by etching the semiconductor active layer 12 with the metallic side wall 17 being used as a mask, the metallic side wall 17 could remain in contact with the active layer 12 or an insufficient gap could be left between the wall 17 and the layer 12, due to insufficient etching, as shown in FIG. 12.

Figure 13:
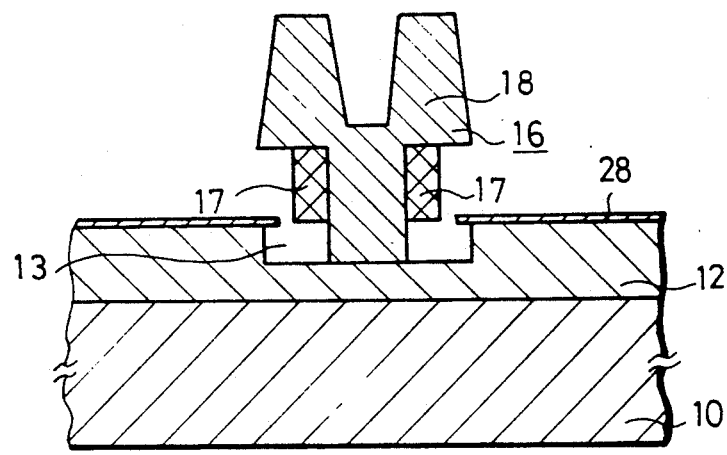
FIG. 13 is a cross-sectional view showing the structure of a gate electrode according to a second embodiment of the present invention.

FIGS. 14 through 17 show a method for making a gate electrode shown in FIG. 13, which can eliminate such likelihood of providing a gate electrode like the one as shown in FIG. 12.

Figure 14:
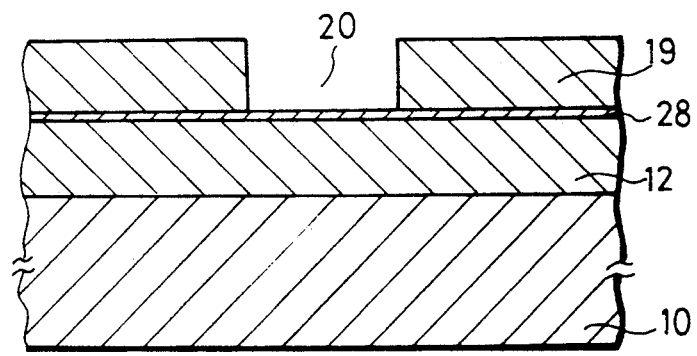
FIG. 14 is a cross-sectional view showing a first step of manufacturing the gate electrode shown in FIG. 13.

As shown in FIG. 14, a spacer layer 28 having a thickness of from about 0.01 $\mu$m to about 0.1 $\mu$m is disposed on the semiconductor active layer 12 on the semiconductor substrate 10. An insulating material, such as $SiN_x$ and SiON, or a undoped semiconductor is used for the spacer layer 28. Then the first photoresist layer 19 is disposed on the spacer layer 28. The photoresist layer 19 is patterned to form the opening 20 therein.

Figure 15:
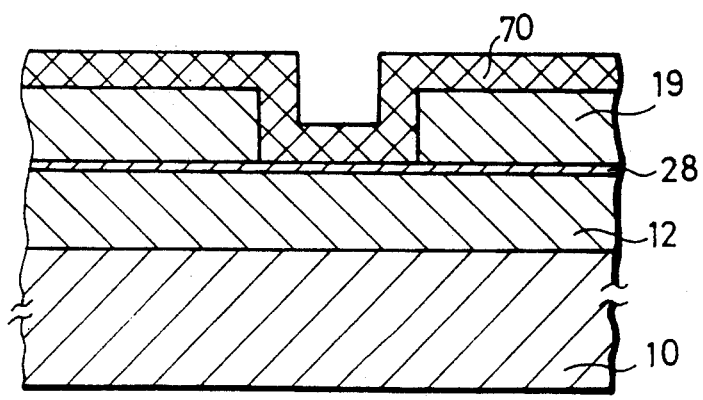
FIG. 15 is a cross-sectional view showing a second step of manufacturing the gate electrode shown in FIG. 13.

Next, as shown in FIG. 15, the metal layer 70 is disposed over the entire surface of the structure shown in FIG. 14.

Figure 16:
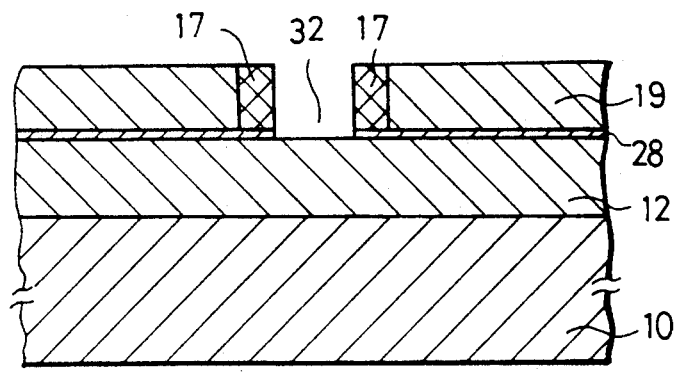
FIG. 16 is a cross-sectional view showing a third step of manufacturing the gate electrode shown in FIG. 13.

The metal layer 70 is subjected to anisotropic etching to leave the portion of the layer 70 which is to become the metallic side wall 17, as shown in FIG. 16. Thereafter, the metallic side wall 17 is used as a mask to etch away a portion of the spacer layer 28 to form an opening 32 therein through which the semiconductor active layer 12 is exposed.

Figure 17:
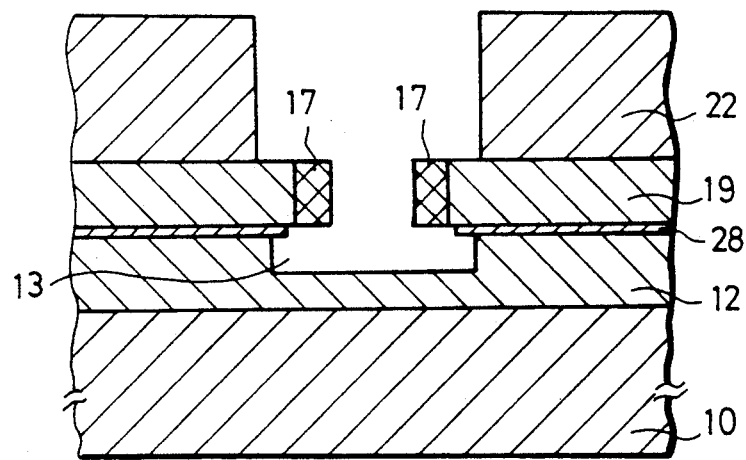
FIG. 17 is a cross-sectional view showing a fourth step of manufacturing the gate electrode shown in FIG. 13.

After that, the second photoresist layer 22 is disposed on the surface of the structure shown in FIG. 16. The second photoresist layer 22 is then patterned to form an opening therein as shown in FIG. 17.

Then, the spacer layer 28 is used as a mask for etching away a portion of the semiconductor active layer 12 to form the recess 13 in the layer 12.

When the device being manufactured is a device such as a high output power FET which needs high breakdown voltage, the width of the recess 13 must be wide. In such a case, a desired amount of the spacer layer 28 is side-etched by means of an etchant which can selectively etch only the spacer layer 28, as shown in FIG. 17. Thereafter, the spacer layer 28 is used as a mask to form the recess 13.

After that, steps similar to the ones shown and described with reference to FIGS. 11 and 5 are followed to complete the gate electrode 16 as shown in FIG. 13. With the structure shown in FIG. 13, even through the etching for forming the recess 13 is more or less insufficient, that the metallic side wall 17 and the active layer 12 never contact each other as in the gate electrode structure shown in FIG. 12.

As described above, according to the present invention, by virtue of the metallic side wall 17 disposed in the leg section of the mushroom-shaped gate electrode with the enlarged head section, the gate electrode has a reduced effective gate length Lg as well as an increased cross-sectional area, and, hence, improved device characteristics, in particular, an improved NF characteristic. Furthermore, according to a method of making a gate electrode according to the present invention, it is possible not only to provide a desired effective gate length Lg by selecting the thickness of the second photoresist layer 22, the width $t_4$ of the opening 24 in the second photoresist layer 22, and the thickness of the metal layer 17 as desired, but also to provide any desired cross-sectional area of the gate electrode by means of the metallic side wall 17. Thus, it is possible to produce a gate electrode having a desired NF characteristic.

What is claimed is:

1. A mushroom-shaped gate electrode for a semiconductor device including a semiconductor substrate having an active layer and a recess, said gate electrode having an enlarged head section, a lower end disposed within the recess and contacting the active layer, a relatively thin section extending from said end to said head section, and a metallic side wall disposed on said relatively thin section adjacent said head section wherein said head section has a width adjacent said relatively thin section wider than said relatively thin section and said metallic side wall combined.

2. A gate electrode according to claim 1 wherein said gate electrode comprises a metal selected from the group consisting of Ti/Pt/Au and WSi, and said metallic side wall comprises one or a combination of at least two metals selected from the group consisting of Al, Au, Ag, Mo, Pt, Ti, W, and WSi.

3. A gate electrode according to claim 1 wherein said relatively thin section has a width transverse to said head section and said end of from 0.1 μm to 0.3 μm, and said metallic side wall is disposed on said relatively thin section in a thickness of from 0.2 μm to 0.3 μm.

4. A semiconductor device comprising:
a semiconductor substrate;
a semiconductor active layer disposed on said substrate and including a recess;
a metal gate electrode including a leg having a first composition and contacting said active layer, disposed within the recess, and having a gate length Lg, a head having the first composition, attached to the leg and having a width measured along the direction of the gate length larger than Lg, and a metal side wall having a second composition different from the first composition disposed on the leg adjacent the head, wherein a width of the leg and metal side wall measured along the direction of the gate length is larger than the gate length Lg and smaller than the width of the head whereby the gate electrode length is shortened without increasing the gate resistance.

5. The semiconductor device of claim 4 wherein the metal side wall is spaced from the semiconductor active layer.

6. The semiconductor device of claim 5 including an electrically insulating film disposed on the active layer and projecting across part of the recess toward and spaced from the metal side wall.

7. A mushroom-shaped gate electrode for a semiconductor device including a semiconductor substrate having an active layer, a recess, and a spacer layer comprising an electrically insulating material disposed on said active layer, said gate electrode having an enlarged head section, a lower end disposed within the recess and contacting the active layer, a relatively thin section extending from said end to said head section, and a metallic side wall disposed on said relatively thin section adjacent said head section wherein said head section has a width adjacent said relatively thin section wider than said relatively thin section and said metallic side wall combined.

8. A gate electrode according to claim 7 wherein said gate electrode comprises a metal selected from the group consisting of Ti/Pt/Au and WSi, and said metallic side wall comprises one or a combination of at least two metals selected from the group consisting of Al, Au, Ag, Mo, Pt, Ti, W, and WSi.

* * * * *